(12) United States Patent
Cowan

(10) Patent No.: US 6,747,473 B2
(45) Date of Patent: Jun. 8, 2004

(54) DEVICE UNDER INTERFACE CARD WITH ON-BOARD TESTING

(75) Inventor: Joseph W. Cowan, West Linn, OR (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 10/252,488

(22) Filed: Sep. 23, 2002

(65) Prior Publication Data
US 2004/0059971 A1 Mar. 25, 2004

(51) Int. Cl.$^7$ ............................................. G01R 31/26
(52) U.S. Cl. ................................. 324/765; 324/158.1
(58) Field of Search ............................... 324/754, 755, 324/756, 757, 758, 759, 760–765, 158.1, 73.1

(56) References Cited

U.S. PATENT DOCUMENTS 4,780,670 A * 10/1988 Cherry ........................ 324/754
5,070,297 A * 12/1991 Kwon et al. ................. 324/754

* cited by examiner

Primary Examiner—Ernest Karlsen
Assistant Examiner—Tung X. Nguyen
(74) Attorney, Agent, or Firm—Christopher P. Maiorana PC

(57) ABSTRACT

The present invention concerns an apparatus comprising a first plurality of contacts, a second plurality of contacts, one or more sockets, and a programmable processor. The first plurality of contacts may be configured to receive one or more first signals. The second plurality of contacts may be configured to present one or more second signals in response to the one or more first signals. The one or more sockets may be configured to receive one or more third signals from one or more programmable devices. The programmable processor may be configured to generate a test signal in response to (i) the one or more first signals and (ii) the one or more third signals.

19 Claims, 2 Drawing Sheets

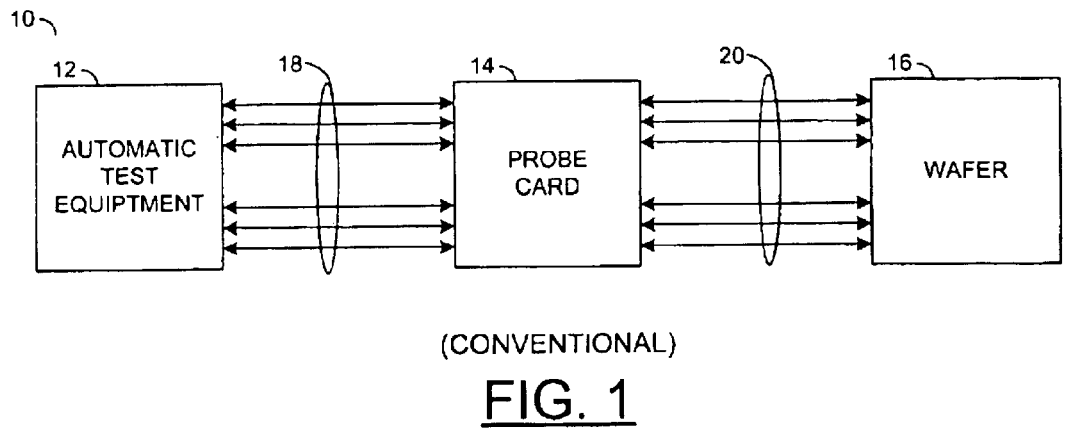
(CONVENTIONAL)
FIG. 1

DEVICE UNDER INTERFACE CARD WITH ON-BOARD TESTING

FIELD OF THE INVENTION

The present invention relates to an integrated circuit testing device generally and, more particularly, to a device under test (DUT) interface card with on-board testing.

BACKGROUND OF THE INVENTION

Conventional integrated circuit (IC) wafer testing involves interconnecting extremely expensive diagnostic tools with each die on a wafer. Automatic Test Equipment (ATE) tester, ATE interface assemblies, and interface cards are the main components used to test integrated circuit wafers. In conventional approaches, the automatic test equipment is connected to a DUT card using ATE interface assemblies. The DUT card forms connections with the wafer or packaged integrated circuit. The automatic test equipment generates the electronic test sequence and applies the test sequence to the DUT card using cable interfacing and the interface assemblies.

Referring to FIG. 1, a block diagram is shown illustrating a conventional automatic test equipment probe card application. An automatic test equipment 12 is connected to a probe card 14 that performs tests on a wafer 16. In an analysis environment, the ATE 12 is connected to the probe card 14 with high quality, expensive cable interfacing 18. The cable interfacing 18 is often long. The automatic test equipment 12 generates an electronic test sequence and applies the test sequence to the probe card 14 via the cable interfacing 18. The probe card 14 then applies the test sequence to the wafer 16 using the local interface path 20. Typically, no logic exists on the probe card 14. The ATE 12 is responsible for controlling the test procedure, generating the test sequence, and receiving the test results.

Problems with conventional approaches include that high speed, high pin count testers with scan capability are expensive and typically not available in the failure analysis lab. Also, the cable interfacing 18 between the probe card 14 and the tester 12 is expensive and cumbersome. Conventional solutions to this problem implement Built-In Self-Test (BIST) circuitry on the dies being fabricated to avoid having to perform high speed automatic tests of the wafers after production using complicated test equipment. However, built-in self-test methodology does not (i) fully test the device to prove that the device is good and/or (ii) adequately condition the device for failure analysis techniques.

It would be desirable to have an interface card that generates test signals locally so that expensive, high-tech interfaces between the automatic test equipment and the probe card are not needed and/or the automatic test equipment would not be needed to perform the test, particularly when the device is connected to analysis equipment.

SUMMARY OF THE INVENTION

The present invention concerns an apparatus comprising a first plurality of contacts, a second plurality of contacts, one or more sockets, and a programmable processor. The first plurality of contacts may be configured to receive one or more first signals. The second plurality of contacts may be configured to present one or more second signals in response to the one or more first signals. The one or more sockets may be configured to receive one or more third signals from one or more programmable devices. The programmable processor may be configured to generate a test signal in response to (i) the one or more first signals and (ii) the one or more third signals.

The objects, features and advantages of the present invention include providing a device under test interface card with on-board test that may (i) be implemented without high speed, high pin count testers with scan capability in the failure analysis lab, (ii) be implemented without expensive, bulky cabling, (iii) be easily manipulated in various failure analysis equipment setups that have tight interface constraints, (iv) allow at-speed, real-time testing (or configuring) due to the capability of replacing the long signal delay paths from the tester through the cable interface to the device under test with short delay paths between the on-board processors and/or memories of the interface card and the device under test, (v) provide multiple setups to operate independently after being programmed by a single programmer, (vi) be implemented without the automatic test equipment to execute tests on the device under test, and/or (vii) allow simple testers to be connected to the probe card.

BRIEF DESCRIPTION OF THE DRAWINGS

These and other objects, features and advantages of the present invention will be apparent from the following detailed description and the appended claims and drawings in which:

FIG. 1 is a block diagram illustrating a conventional automatic test equipment probe card application;

DETAILED DESCRIPTION OF THE PREFERRED EMBODIMENTS

Figure 2:
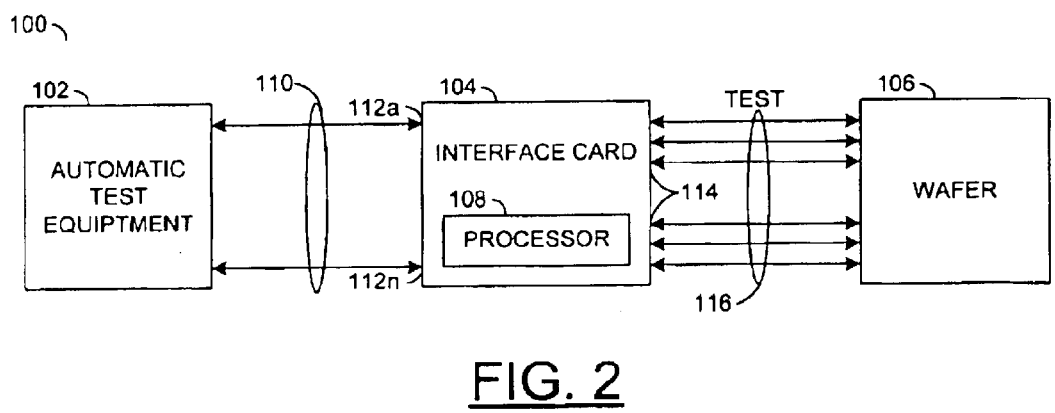
FIG. 2 is a block diagram illustrating the context of the present invention.

Referring to FIG. 2, a block diagram of a system 100 illustrating the context of the present invention is shown. The system 100 may be an automatic test application for a device under test (DUT) (e.g., a wafer or packaged integrated circuit produced in a FAB). The system 100 may comprise an automatic test equipment (ATE) device 102, an interface card 104, and the device under test 106. The interface card 104 may be referred to as a DUT card, a socket card (e.g., in packaged devices), or a probe card (e.g., in wafers). In one example, the device under test 106 may be a wafer produced in a silicon processing wafer fabrication facility (e.g., FAB). The interface card 104 may be implemented with an on-board processor and/or memory 108. In one example, the ATE 102 may be connected to the interface card 104 using simpler, less expensive cable interfacing 110, as compared to the conventional approach described in the background section. The interface card 104 may have a plurality of contacts 112a–112n that may connect to the cable interfacing 110. Such inexpensive cabling may be implemented because the automatic test equipment 102 may not be responsible for generating a test signal (e.g., TEST) at a high frequency (e.g., 15 Mhz). The ATE 102 may simply provide commands to the interface card 104 and monitor test results via the cable interfacing 110. In one example, the cable interfacing 110 may be bi-directional. The processor 108 may receive the commands via the cable interfacing 110 and generate the signal TEST local to the interface card 104. The cable interfacing 110 may be implemented using common cabling and/or interfacing standards such as serial, parallel, USB, and/or Firewire.

In another example, the automatic test equipment 102 may be omitted when analyzing the wafer or packaged device 106. The ATE 102 may be connected to the interface card 104 with the cable interfacing 110 to program the processor 108 and/or an associated processor memory. Alternatively, a memory may be programmed apart from the interface board 104 and inserted onto a socket on the interface card 104. The interface card 104 may be programmed to execute tests on the device under test 106 without the ATE 102 being connected. Instead of cabling a large, expensive production tester such as the automatic test equipment 12 of the conventional approach to the interface card 104, simpler testers, function or waveform generators, device tracers, oscilloscopes and/or power supplies may be used to connect to the interface card 104. Devices with built-in self-test implementation may make it easier to eliminate the automatic test equipment 102 from the test procedure.

The interface card 104 may have a multi-bit I/O connection 114. The signal TEST may be applied to the wafer 106 via a bus 116. The bus 116 may connect to the multi-bit I/O connection 114. The bus 116 may be shorter in length than the cable interfacing 110 and may be implemented in an integrated circuit board. Thus, the bus 116 may not present the technical challenges in carrying a high frequency signal TEST (e.g., 1–5 Mhz) that the external cable interfacing 110 may present. In one example, the bus 116 may be bi-directional.

Figure 3:
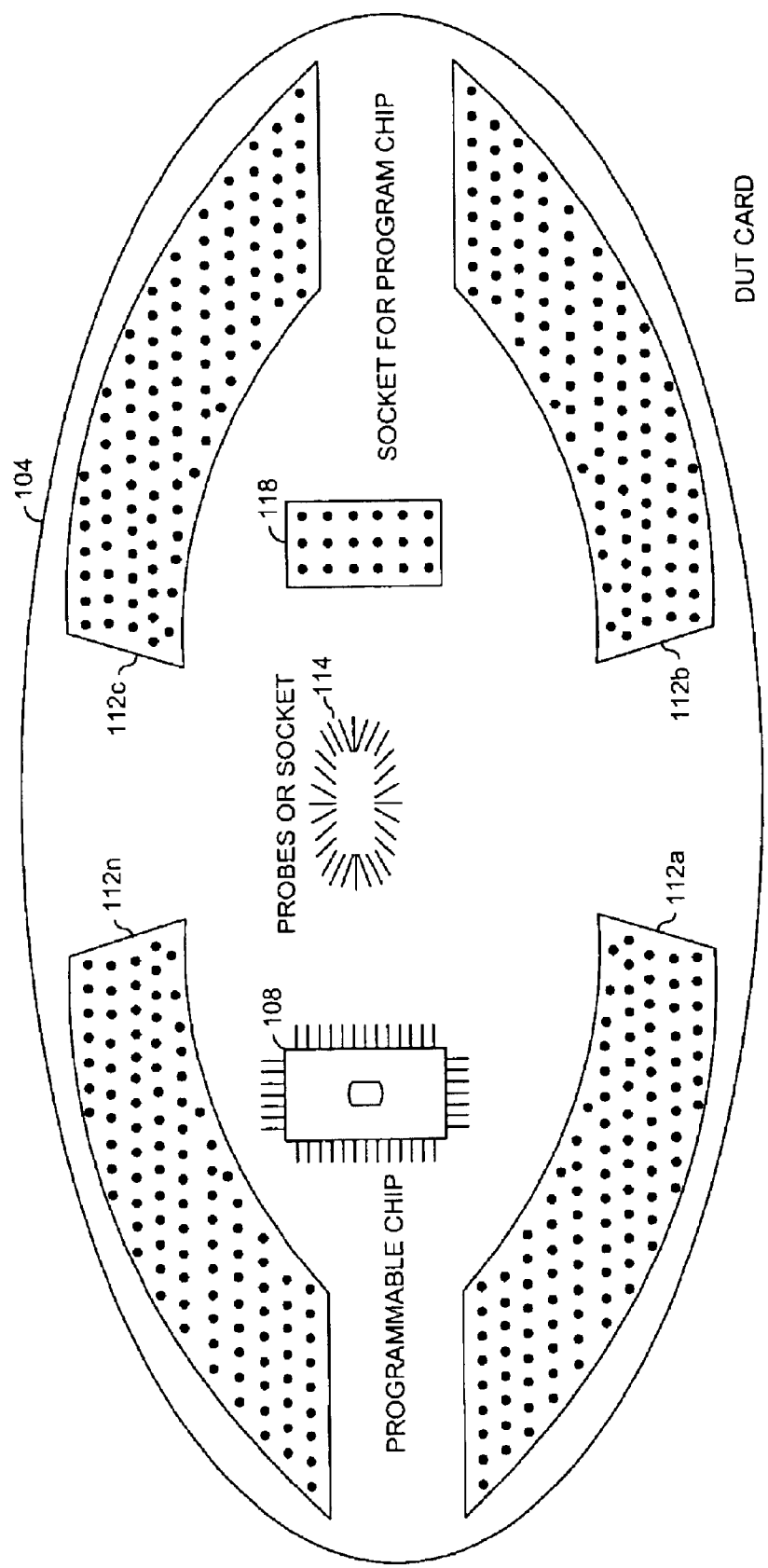
FIG. 3 is a block diagram illustrating a preferred embodiment of the present invention.

Referring to FIG. 3, a diagram is shown illustrating an interface card 104 in accordance with a preferred embodiment of the present invention. The interface card (or probe card) 104 may comprise the programmable chip (or on-board processor) 108, a series of multiple contacts 112a–112n, a multi-bit I/O connection comprising a collection of probe needles or contacts 114, and a socket 118. The contacts 112a–112n may connect the probe card 104 to an interface assembly that leads to the cable interfacing 110. The probe pins 114 may comprise a plurality of probe needles or other connection devices. In one example, several hundred probe needles may be implemented. However, the particular number of probe needles may be varied accordingly to meet the design criteria of a particular implementation. The probe needles 114 may be positioned to establish electrical contact with a series of metalized pads on the device under test (e.g., the integrated circuit wafer 106). The socket 118 may be a socket for a programmable chip or a memory that may work in conjunction with and/or in place of the probe board on-board processor 108. The processor 108 may be a programmable chip that may interface with the automatic test equipment 102 via the cable interfacing 110 and generate the signal TEST to be applied to the wafer 106.

The processor 108 may be programmed to perform the test sequence on a variety of unique devices (e.g., different wafers, different packaged ICs, etc.). The interface card 104 may then recognize the device 106 and apply the appropriate test sequence (e.g., a proper form of the signal TEST) without the aid of the automatic test equipment 102.

The processor 108 and/or the programmable chip or memory that may be placed in the socket 118 on the probe card 104 may be implemented using flash Electrically Erasable Programmable Read Only Memory (EEPROM), Compact Flash, a memory stick, and/or an integrated circuit card (ICC) (e.g., a smart card with an embedded IC). The probe board 104 with the integrated processor 108 (e.g., a memory with a reader or microprocessor) may be capable of clock speeds of 1–5 Mhz and may provide storage of 256 Megabytes or more. Only a few scan frames of the test sequence may be stored in memory. The onboard processor 108 may execute a program to generate the test sequence in a logical pattern as the test progresses on the device under test 106. A system connected to the probe card 104 may control the scan I/O, clock, and enable pins (e.g., a test access port controller, or JTAG pins). Designs that implement Joint Test Action Group (JTAG) testing/hardware may be implemented. An example of JTAG hardware may be defined in the JTAG specification IEEE Standard 1149a-1990 and/or IEEE Standard 1149b-1994, which are each hereby incorporated by reference in their entirety.

Other device under test signal pins may be pulled up or tri-stated by an external pin (e.g., IDDTN). The pin IDDTN may provide a quiescent (e.g., DC) testing powerdown signal. The pin IDDTN may enable a powerdown mode to test the IDDQ quiescent current during a manufacturing test. The pin IDDTN may control a state of I/O buffers having pull-up/pull-down transistors and some special current-drawing core cells. In the quiescent state, the gates do not generally toggle and current does not flow through the pull-up/pull-down transistors. When an IDDQ test is being run, the I/O and core cells do not generally draw current. The programmable device under test card 104 may condition the device under test (e.g., the wafer 106) to a known static IDD state or cycle the card 104 through a few scan frames for use with failure analysis equipment. The present invention generally eliminates the need to interface fault analysis equipment to expensive testers with cumbersome cable setups to prepare the unit for electrical fault isolation.

The processor 108 and/or a processor and/or memory in the socket 118 may be implemented using PROMs, EPROMs, EEPROMS, MPUs/RAMs and other programmable logic. The present invention may be used for device analysis instead of failure analysis. Additionally, the test chip 108 and/or a processor in the socket 118 on the DUT board 104 may be used as multiplexers to increase the pin coverage of the tester. The programmable devices on the probe card 104 may be programmed to provide any desired function to meet the requirements of a particular application. The various sockets and/or connections may be modified accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first plurality of contacts configured to receive one or more first signals from a first device;
   a second plurality of contacts configured to present one or more second signals to a second device in response to said one or more first signals;
   one or more sockets configured to receive one or more third signals from one or more programmable devices; and
   a programmable processor configured to generate a test signal in response to (i) said one or more first signals and (ii) said one or more third signals.

2. The apparatus according to claim 1, wherein (i) said second device comprises a device under test and (ii) said test signal comprises a test sequence for said device under test.

3. The apparatus according to claim 2, wherein said device under test comprises a water or a packaged integrated circuit.

4. The apparatus according to claim 1, wherein said programmable devices comprise a memory.

5. The apparatus according to claim 1, wherein said programmable devices comprise a processor.

6. The apparatus according to claim 1, wherein said first plurality of contacts comprises connectors that connect to an interface assembly connected to an automatic test equipment.

7. The apparatus according to claim 1, wherein said second plurality of contacts comprises a collection of probe needles to connect to said second device.

8. The apparatus according to claim 1, wherein said apparatus comprises an automatic test equipment interface card.

9. The apparatus according to claim 8, wherein said automatic test equipment interface card is implemented with a high speed, high pin count tester with scan capability in a failure analysis lab.

10. The apparatus according to claim 8, wherein said apparatus allows for at-speed, real-time testing of a device under test.

11. The apparatus according to claim 8, wherein said apparatus provides multiple setups to operate independently on different devices under test after being programmed by a single programmer without being connected to said programmer during test sequences.

12. The apparatus according to claim 2, wherein said test sequence comprises a failure analysis.

13. The apparatus according to claim 2, wherein said test sequence comprises a sequence configured to execute device analysis.

14. The apparatus according to claim 2, wherein said apparatus works in conjunction with a built-in self-test circuit on said device under test.

15. The apparatus according to claim 2, wherein said apparatus generates test signals with said programmable processor to be applied to the device under test.

16. An apparatus comprising:

means for receiving one or more first signals from a first device;

means for presenting one or more second signals to a second device in response to said one or more first signals to a second device;

means for receiving one or more third signals from one or more programmable devices; and means for generating a test signal in response to (i) said one or more first signals and (ii) said one or more second signals.

17. A method of generating a test output for a device under test comprising the steps of:

(A) programming one or more programmable devices on a device under test interface card;

(B) interfacing between said device under test interface card and said device under test with a first plurality of contacts;

(C) interfacing with a controller through a second plurality of contacts; and (D) executing a program stored in said one or more programmable devices to generate said test output.

18. The method according to claim 17, wherein said one or more programmable devices comprise processors and memories.

19. The method according to claim 17, wherein said device under test comprises a wafer or a packed integrated circuit.

* * * * *

UNITED STATES PATENT AND TRADEMARK OFFICE
CERTIFICATE OF CORRECTION

PATENT NO.     : 6,747,473 B2
DATED          : June 8, 2004
INVENTOR(S)    : Joseph W. Cowan It is certified that error appears in the above-identified patent and that said Letters Patent is hereby corrected as shown below:

Title page,
Item [54], Title, should read -- DEVICE UNDER TEST INTERFACE CARD WITH ON-BOARD TESTING --

Signed and Sealed this

Twenty-ninth Day of March, 2005

JON W. DUDAS
*Director of the United States Patent and Trademark Office*